(12) United States Patent
Saho

(10) Patent No.: US 8,091,216 B2
(45) Date of Patent: Jan. 10, 2012

(54) ELECTRONIC PARTS MOUNTING APPARATUS AND ELECTRONIC PARTS MOUNTING METHOD

(75) Inventor: Hidehiro Saho, Saga (JP)

(73) Assignee: Panasonic Corporation, Osaka (JP)

(*) Notice: Subject to any disclaimer, the term of this patent is extended or adjusted under 35 U.S.C. 154(b) by 1761 days.

(21) Appl. No.: 10/754,742

(22) Filed: Jan. 9, 2004

(65) Prior Publication Data
US 2004/0139602 A1  Jul. 22, 2004

(30) Foreign Application Priority Data
Jan. 15, 2003  (JP) .............................. P. 2003-007173

(51) Int. Cl.
B23P 19/00  (2006.01)
H05K 3/30  (2006.01)

(52) U.S. Cl. ................ 29/743; 29/740; 29/739; 29/832; 29/833; 29/834

(58) Field of Classification Search ............ 29/720–722, 29/740–743, 832–834, 712; 414/737, 225.01; 294/2, 64.1
See application file for complete search history.

(56) References Cited

U.S. PATENT DOCUMENTS

| | | | |
|---|---|---|---|
| 4,875,285 A | 10/1989 | Haan et al. | |
| 5,588,195 A * | 12/1996 | Asai et al. | 29/33 M |
| 5,778,525 A | 7/1998 | Hata et al. | |
| 5,911,456 A * | 6/1999 | Tsubouchi et al. | 29/833 |
| 6,101,709 A * | 8/2000 | Shiota | 29/833 |
| 6,195,878 B1 * | 3/2001 | Hata et al. | 29/832 |
| 6,216,341 B1 * | 4/2001 | Nakahara | 29/833 |
| 6,446,331 B1 * | 9/2002 | Horigome | 29/832 |
| 6,467,158 B1 * | 10/2002 | Kiyomura et al. | 29/740 |
| 6,568,069 B1 | 5/2003 | Melf et al. | |
| 6,662,437 B2 * | 12/2003 | Kawashima | 29/740 |

FOREIGN PATENT DOCUMENTS

| | | |
|---|---|---|
| CN | 1345179 | 4/2002 |
| DE | 100 16 130 C1 | 8/2001 |
| EP | 0962125 | 12/1999 |
| EP | 1 121 010 A2 | 8/2001 |
| JP | 9-130084 | 5/1997 |
| JP | 10-070398 A | 3/1998 |

(Continued)

OTHER PUBLICATIONS

European Office Action Dated Nov. 5, 2007.

(Continued)

*Primary Examiner* — Minh Trinh
(74) *Attorney, Agent, or Firm* — Pearne & Gordon LLP

(57) ABSTRACT

An electric parts mounting apparatus includes rotary type multi-nozzle mounting heads. Each of the mounting heads has a plurality of suction nozzles disposed in a radial manner on a rotor mechanism, which rotates around a rotation shaft. A parts mount mechanism is configured such that the axial direction of the rotation shaft coincides with an arrangement direction of tape feeders. A shaft-to-shaft distance of the suction nozzles is set to be plural times as large as a pitch of the feeder arrangement. In a pick up process, a plurality of electronic parts can be simultaneously picked up from the tape feeders. In a parts mounting process, while one of the mounting heads mounts the part, the other mounting head can complete a nozzle changeover operation such that the suction nozzle holding an electronic part to be mounted next is moved to an operation position.

7 Claims, 6 Drawing Sheets

FOREIGN PATENT DOCUMENTS

| | | |
|---|---|---|
| JP | 11-214896 A | 8/1999 |
| JP | 2000-114789 A | 4/2000 |
| JP | 2001-210994 A | 8/2001 |
| WO | WO 01/76343 A1 | 10/2001 |
| WO | 01-91533 | 11/2001 |

OTHER PUBLICATIONS

Chinese Office Action dated Aug. 7, 2007.
Japanese Office Action, dated Oct. 7, 2008.

* cited by examiner

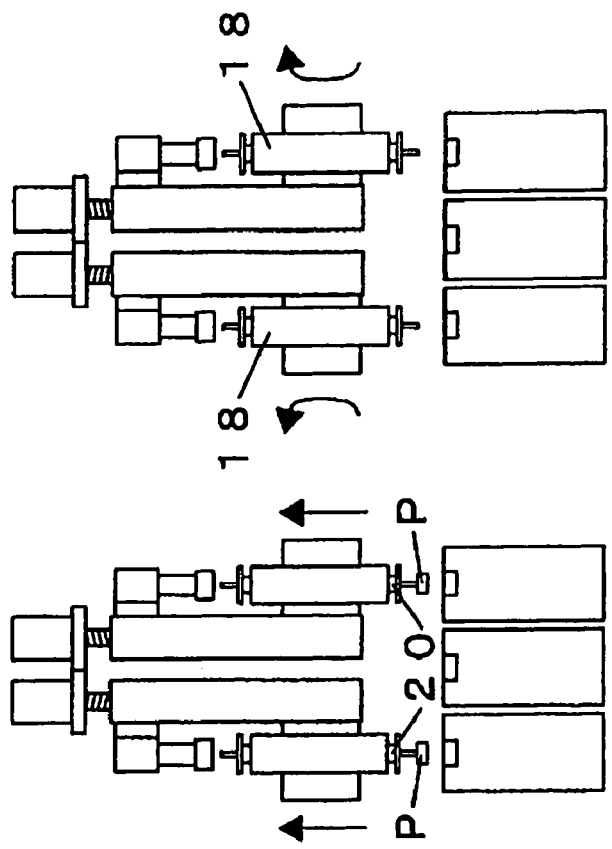
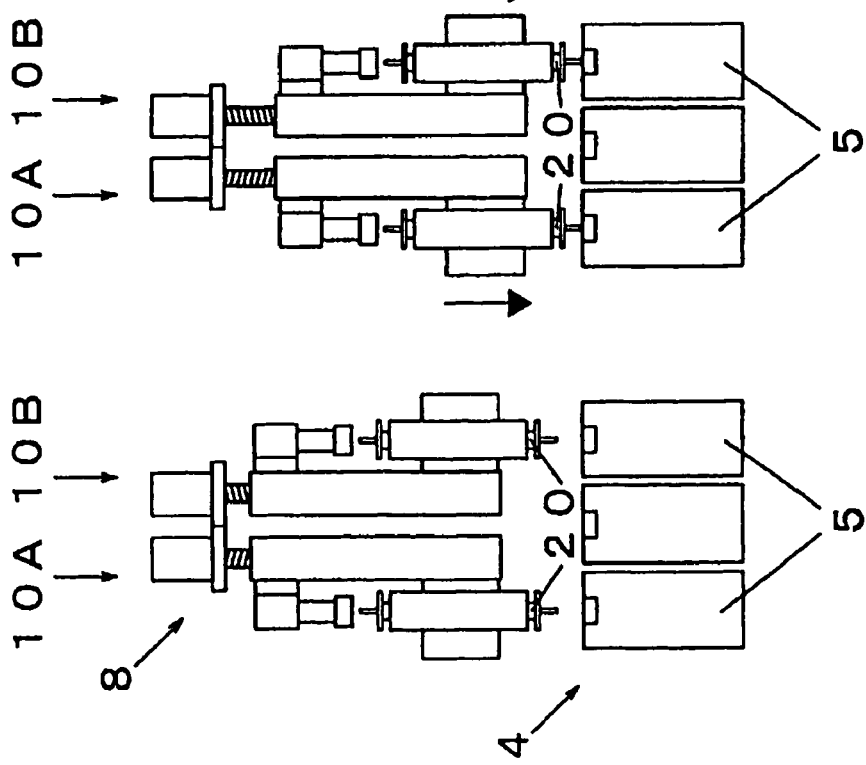

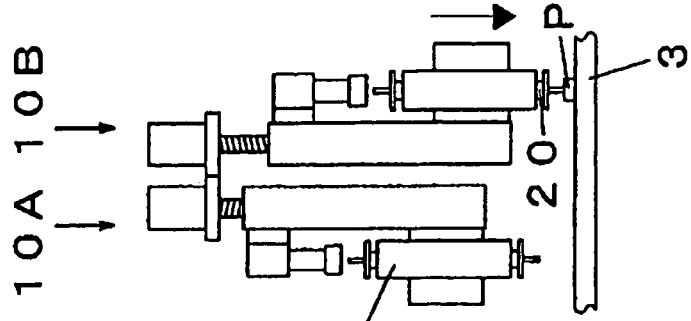
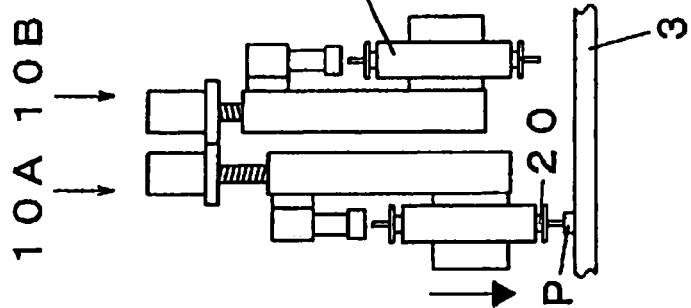
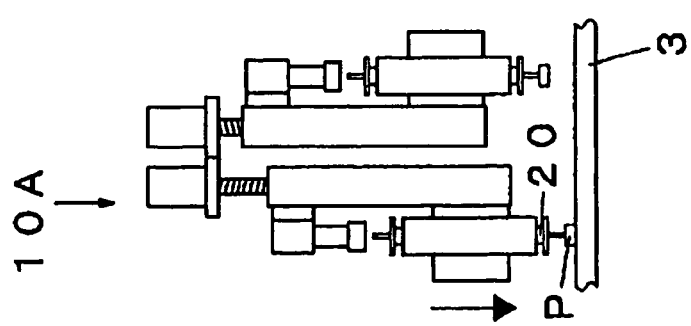
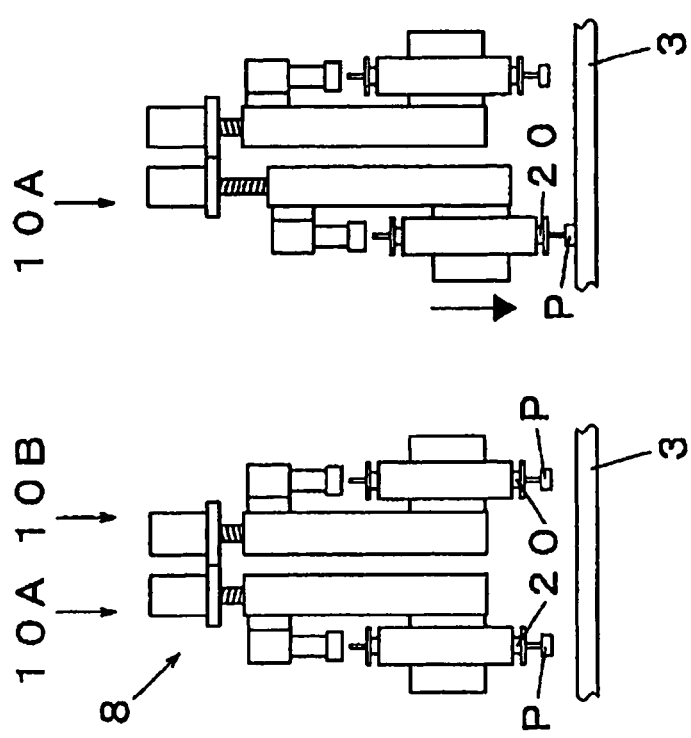

ELECTRONIC PARTS MOUNTING APPARATUS AND ELECTRONIC PARTS MOUNTING METHOD

BACKGROUND OF THE INVENTION

The present invention relates to an electronic parts mounting apparatus and an electronic parts mounting method for mounting electronic parts on a board.

The electronic parts mounting apparatus for mounting electronic parts on a board is provided with a mounting head which takes out electronic parts from a parts supply portion, then transfers and mounts the electronic parts on the board. As the mounting heads, there is widely known a multi-nozzle type mounting head which is arranged in a manner that a plurality of suction nozzles each for sucking and holding an electronic part are provided so as to mount a plurality of electronic parts in one mounting turn operation thereby to improve the mounting efficiency.

As such a multi-nozzle type mounting head, a rotary type multi-nozzle type head is known in which a plurality of suction nozzles are disposed in a radial manner on a rotary member capable of rotating around a rotation shaft which is disposed horizontally (see JP-A-9-130084, for example). When employing such a rotary type, in addition to the advantage of the aforesaid multi-nozzle type, there is an advantage that, without moving the mounting head itself, a plurality of the suction nozzles can be sequentially aligned with the same parts feeder thereby to continuously pick up electric parts.

In recent years, due to the demand for improving the productivity, further increasing of the mounting speed has been required even for the electronic parts mounting apparatus provided with the rotary type multi-nozzle type mounting head. In order to increase the mounting speed in the conventional electronic parts mounting apparatus, it is required to increase the number of electronic parts capable of being taken out simultaneously by increasing the number of the suction nozzles and also to increase the rotation speed at the time of changing over the suction nozzle.

However, in the rotary type, since the suction nozzles each in a state of sucking and holding an electronic part are intermittently rotated, the circumferential speed of the rotary member at the time of rotation is restricted in order to stably hold the electronic parts. Thus, the increase of the number of the suction nozzles and the increase of the rotation speed is limited.

SUMMARY OF THE INVENTION

Accordingly, an object of the invention is to provide an electronic parts mounting apparatus and an electronic parts mounting method which is provided with rotary type multi-nozzle type mounting heads and can realize a mounting operation stably with a high efficiency.

An electronic parts mounting apparatus according to the invention is arranged to take out electronic parts from a parts supply portion, then transfer and mount the parts on a board, the electronic parts mounting apparatus includes: a board positioning portion for positioning the board transferred in a first direction; parts feeders arranged with a predetermined pitch along the first direction at the parts supply portion; a plurality of mounting heads in each of which a plurality of suction nozzles, each revolving around a horizontal rotation shaft set so as to be aligned with the first direction and being capable of sucking and holding the electronic part, are disposed in a radial manner around the rotation shaft; and head moving means for integrally moving a plurality of the mounting heads between the parts supply portion and the board positioning portion.

An electronic parts mounting method according to the invention is arranged in a manner that in the electronic parts mounting method for transferring and mounting electronic parts on a board by using an electronic parts mounting apparatus which comprising: a board positioning portion for positioning the board transferred in a first direction; parts feeders arranged with a predetermined pitch along the first direction at the parts supply portion; a plurality of mounting heads in each of which a plurality of suction nozzles, each revolving around a horizontal rotation shaft set so as to be aligned with the first direction and being capable of sucking and holding the electronic part, are disposed in a radial manner around the rotation shaft; and head moving means for integrally moving a plurality of the mounting heads between the parts supply portion and the board positioning portion, the electronic parts mounting method includes: a pick-up step for moving a plurality of the mounting heads to the parts supply portion and taking out electronic parts from the parts feeders by using the suction nozzles of the mounting heads; a head moving step for moving a plurality of the mounting heads holding the electronic parts to the board positioning portion; and a parts mounting step for sequentially mounting the electronic parts held by the respective suction nozzles on mounting points of the board by a plurality of the mounting heads, respectively, wherein in the parts mounting step, while the suction nozzle in one of the mounting heads is moved up and down with respect to the board to mount an electronic part held by the suction nozzle on the board, the suction nozzle holding an electronic part to be mounted next in another of the mounting heads is revolved around the rotation shaft.

According to the invention, in the parts mounting step for mounting sequentially mounting the electronic parts held by the respective suction nozzles on the mounting points of the board by a plurality of the mounting heads, respectively, while the suction nozzle in one of the mounting heads is moved up and down with respect to the board to mount an electronic part held by the suction nozzle on the board, the suction nozzle holding an electronic part to be mounted next in another of the mounting heads is revolved around the rotation shaft thereby to complete the nozzle change-over operation for the next mounting operation. Thus, the electronic parts mounting apparatus provided with the rotary type multi-nozzle type mounting head can realize a mounting operation stably with a high efficiency.

BRIEF DESCRIPTION OF THE DRAWINGS

FIGS. 4(a) to 4(d) are diagrams for explaining the process of the electronic parts mounting method according to the embodiment of the invention.

FIGS. 5(a) to 5(d) are diagrams for explaining the process of the electronic parts mounting method according to the embodiment of the invention.

DETAILED DESCRIPTION OF THE PREFERRED EMBODIMENTS

Figure 1:
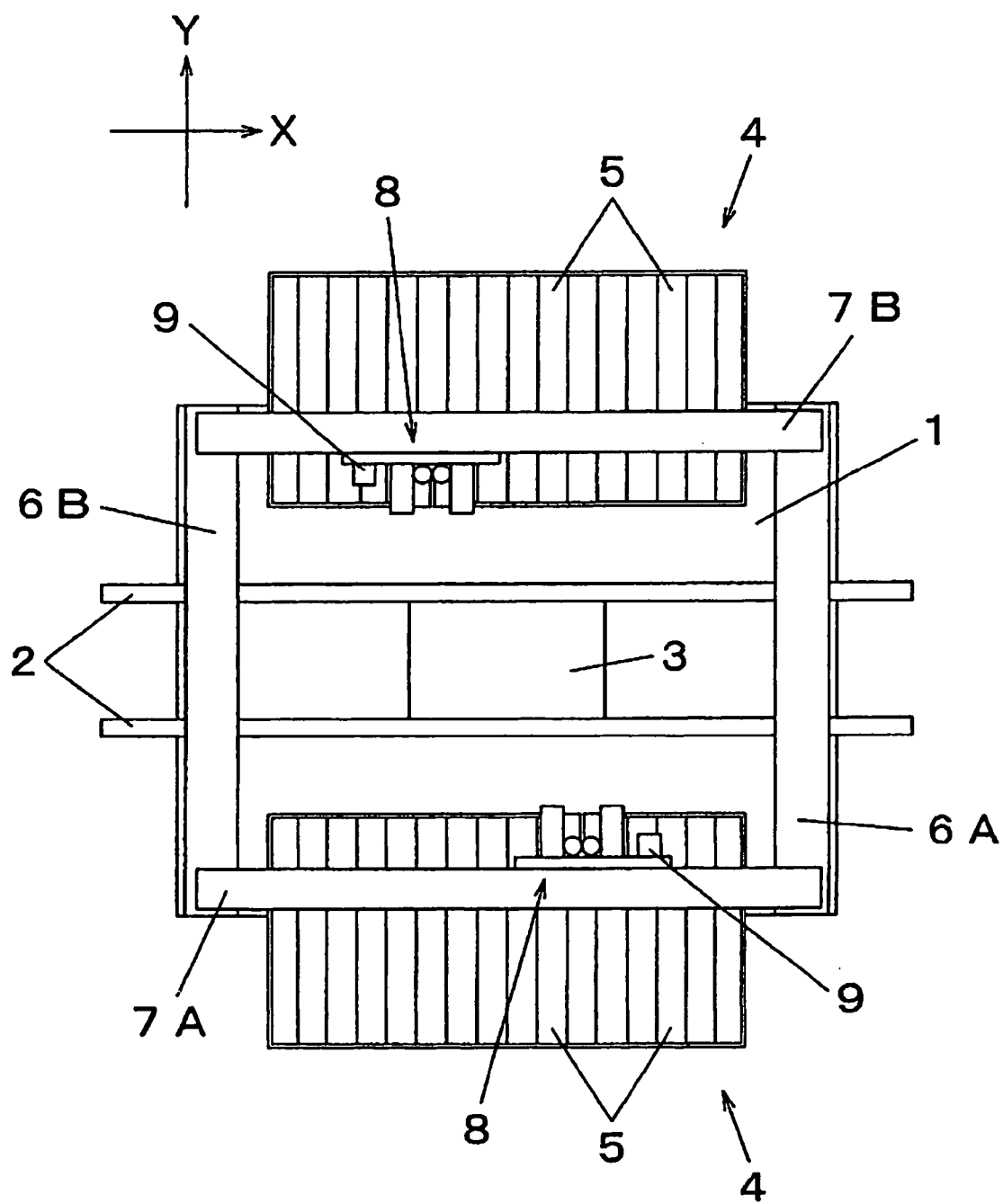
FIG. 1 is a plan view showing the electronic parts mounting apparatus according to an embodiment of the invention.
Figure 2:
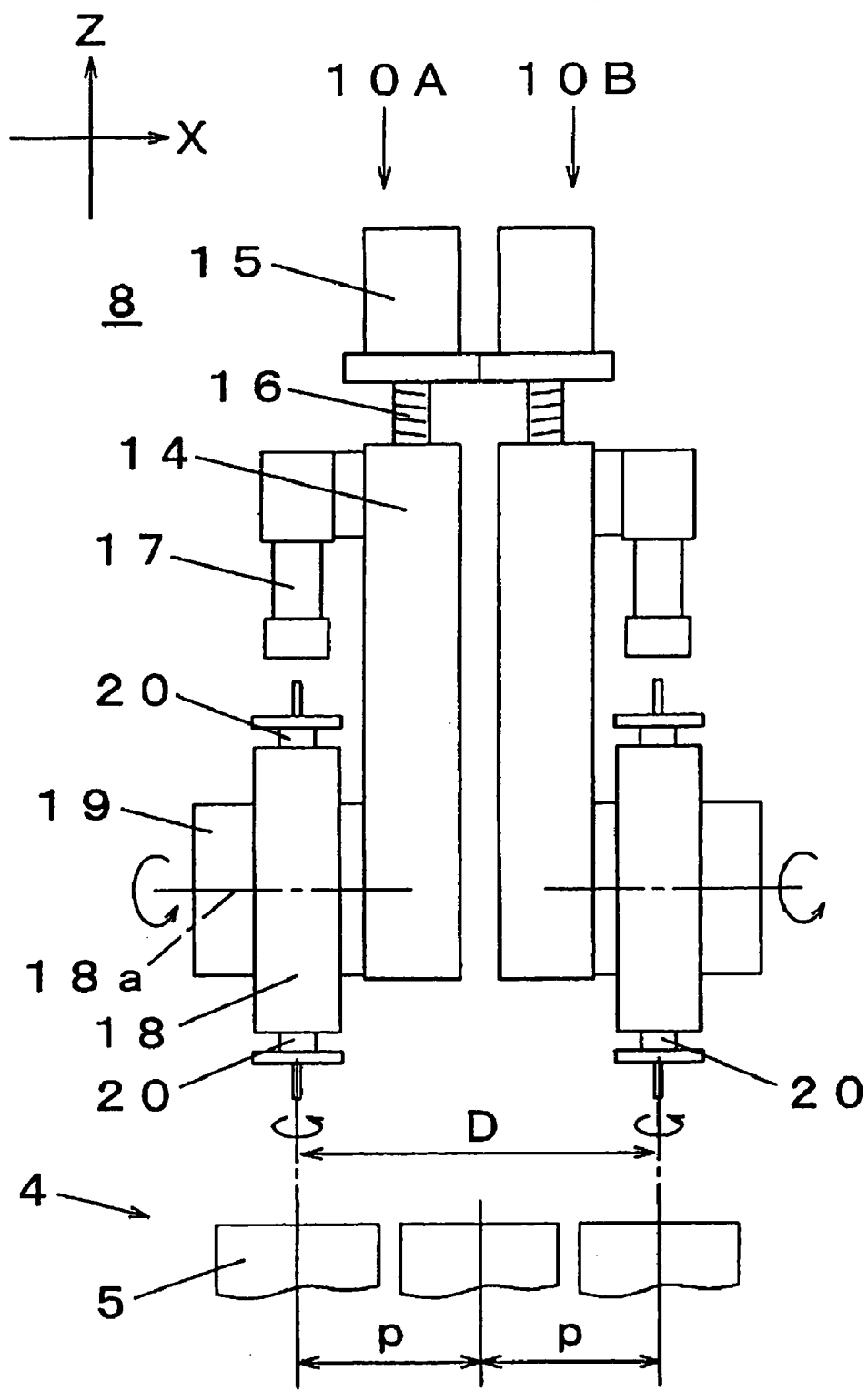
FIG. 2 is a front view showing the mounting head of the electronic parts mounting apparatus according to the embodiment of the invention.
Figure 3:
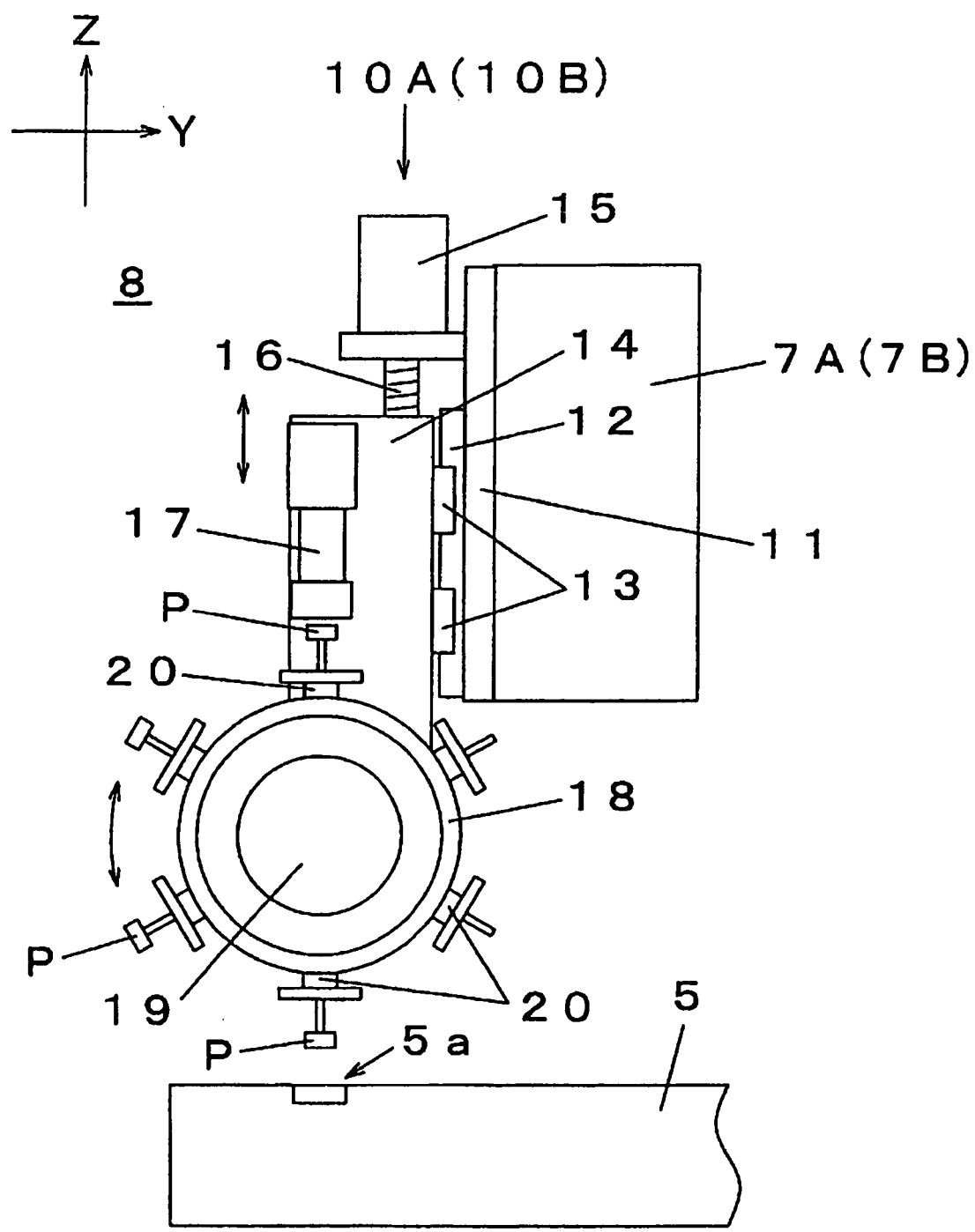
FIG. 3 is a side view showing the mounting head of the electronic parts mounting apparatus according to the embodiment of the invention.
Figure 6:
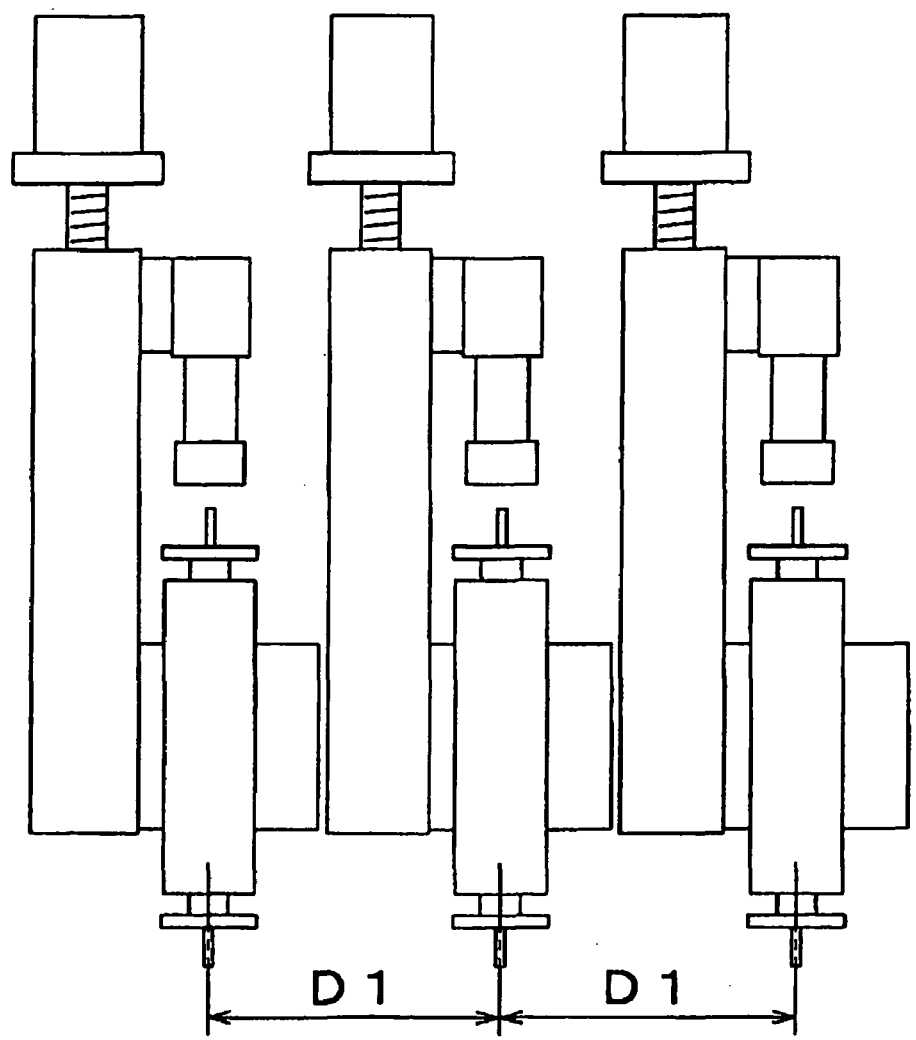
FIG. 6 is a front view showing the mounting head of the electronic parts mounting apparatus according to the embodiment of the invention.

Next, an embodiment of the invention will be explained with reference to the accompanying drawings. FIG. 1 is a plan view showing the electronic parts mounting apparatus according to the embodiment of the invention, FIG. 2 is a front view showing the mounting head of the electronic parts mounting apparatus according to the embodiment of the invention, FIG. 3 is a side view showing the mounting head of the electronic parts mounting apparatus according to the embodiment of the invention, FIGS. 4(*a*) to 4(*d*) and 5(*a*) to 5(*d*) are diagrams for explaining the processes of the electronic parts mounting method according to the embodiment of the invention, and FIG. 6 is a front view showing the mounting head of the electronic parts mounting apparatus according to the embodiment of the invention.

First, the entire configuration of the electronic parts mounting apparatus will be explained with reference to FIG. 1. In FIG. 1, 1 transfer paths 2 are disposed along an X-axis direction (first direction) at the center of a base table 1. The transfer paths 2 serve as a board positioning portion which transfers a board 3 in the X-axis direction and positions it at the mounting position of electronic parts. A parts supply portion 4 is disposed at each of the both sides of the transfer paths 2. At each of the parts supply portions 4, tape feeders 5 serving as parts feeders are disposed with a predetermined pitch along the X-axis direction. Each of the tape feeders 5 houses therein electronic parts held by a tape and feeds the tape in a pitch by pitch manner thereby to supply the electric parts.

Y-axis tables 6A, 6B are respectively disposed on both end portions of the base table 1 and two X-axis tables 7A, 7B are provided so as to cross over the Y-axis tables 6A, 6B. The X-axis table 7A moves horizontally along the Y-axis direction when the Y-axis table 6A is driven, whilst the X-axis table 7B moves horizontally along the Y-axis direction when the Y-axis table 6B is driven. Each of the X-axis tables 7A, 7B is attached with a parts mount mechanism 8 and a camera 9 which integrally moves with the parts mount mechanism 8.

When the Y-axis table 6A, the X-axis table 7A, the Y-axis table 6B and the X-axis table 7B are suitably combined and driven, each of the parts mount mechanisms 8 moves horizontally together with a plurality of mounting heads described later and the cameras 9, then picks up electronic parts from the parts supply portion 4 by the suction nozzles provided at the mounting heads, then transfers and mounts the electronic parts on the board 3 positioned on the transfer paths 2. The Y-axis table 6A, the X-axis table 7A, the Y-axis table 6B and the X-axis table 7B serve as a head moving means for integrally moving a plurality of the mounting heads between the parts supply portion 4 and the board positioning portion. The camera 9 moved above the board 3 together with the mounting heads photographs the board 3 to recognize the position.

Next, the explanation will be made as to the parts mount mechanism 8 with reference to FIGS. 2 and 3. As shown in FIG. 2, the parts mount mechanism 8 is configured in a manner that a plurality (two in this embodiment) of the mounting heads 10A, 10B are secured together in parallel so as to be movable integrally and such that they cannot be moved independently. A distance between the mounting heads 10A, 10B is set in a manner that the shaft-to-shaft distance D between the suction nozzles 20 respectively provided at the mounting heads is plural times as large as the arrangement pitch p of the tape feeders 5 of the parts supply portion 4.

The explanation will be made as to the mounting head 10A (10B). As shown in FIG. 3, a guide rail 12 is disposed vertically on the moving plate 11 of the X-axis table 7A (7B). Sliders 13 fit with the guide rail 12 so as to slide freely therealong is fixed to an elevating block 14. The elevating block 14 moves up and down by an elevation mechanism formed by the combination of a Z-axis motor 15 and a feed screw 16.

A rotor mechanism 18 capable of freely rotating around a horizontal rotation shaft 18*a* (see FIG. 2) set along the X-axis direction is provided on the side surface of the lower portion of the elevating block 14. The rotor mechanism 18 is provided with a plurality of the suction nozzles 20 which are disposed in a radiation manner at the same interval around the rotation shaft 18*a*. When the rotor mechanism 18 is rotated by a rotor rotation mechanism 19, each of the suction nozzles 20 revolves in an attachment posture where an suction hole thereof is directed outward within a vertical plane (YZ-planes) orthogonal to the X-axis direction. In this manner, a nozzle change-over operation is performed in which a particular nozzle of a plurality of the suction nozzles 20 is moved to a desired operation position.

The most lower end position of the rotor mechanism 18 serves as a part sucking and mounting position. In the part suction operation, as shown in FIG. 3, first, the part sucking and mounting position is aligned with the part pick-up position 5*a* of the tape feeder 5, and the rotor mechanism 18 is rotated thereby to move the suction nozzle 20 subjected to the part suction operation to the lower end portion of the rotor mechanism 18. Thus, this suction nozzle 20 is positioned above the part pick-up position 5*a* in a posture that its suction hole is directed downward.

Then, in this state, when the Z-axis motor 15 is driven to move the elevating block 14 up and down, the suction nozzle 20 sucks and holds the electronic part P from the part pick-up position 5*a* through vacuum suction. As shown in FIG. 2, since the shaft-to-shaft distance D between the suction nozzles 20 of the mounting heads 10A, 10B is set to be the plural times as large as the arrangement pitch p of the tape feeders 5, the two mounting heads 10A, 10B can be simultaneously aligned with respect to the tape feeder 5 and so a plurality of parts can be simultaneously sucked by the mounting heads 10A, 10B which move integrally.

In this state, when the rotor mechanism 18 is rotated, the suction nozzles 20 sucking and holding the electronic parts P are sequentially moved upward. When the suction nozzle 20 reaches the upper end portion of the rotor mechanism 18, the electronic part P thus held is directed upward. The upper end portion of the rotor mechanism 18 serves as a parts recognition position, and so the electronic part P arrived at the parts recognition position is recognized by a parts recognition camera 17.

The suction nozzles 20 are arranged to rotate around a nozzle shaft by a nozzle θ shaft mechanism (not shown) contained in the rotor mechanism 18. At the time of mounting the electronic part held by the suction nozzle 20 on the board 3, the suction nozzle 20 is rotated around the nozzle shaft based on the recognition result of the parts recognition camera 17 to correct the positional deviation of the electronic part in the rotation direction around the nozzle shaft.

The electronic parts mounting apparatus is configured in the aforesaid manner. Next, the mounting operation of the electronic parts mounting apparatus thus configured will be explained with reference to FIGS. 4 and 5. First, as shown in FIG. 4(a), the parts mount mechanism 8 equipped with the mounting heads 10A, 10B is moved to the parts supply portion 4, and the mounting heads 10A, 10B are aligned with the tape feeders 5, respectively.

Next, as shown in FIG. 4(b), the suction nozzles 20 of the mounting heads 10A, 10B are moved up and down with respect to the tape feeders 5, whereby the electronic parts P are picked up by the suction nozzles 20 of the mounting heads from the tape feeders 5, respectively, as shown in FIG. 4(c) (a pick-up process). In this pick-up process, the electronic parts P are simultaneously picked-up from the tape feeders 5 by the mounting heads 10A, 10B.

Thereafter, the rotor rotation operation is performed so as to change over the nozzles. That is, as shown in FIG. 4(d), in each of the mounting heads 10A, 10B, the rotor mechanism 18 is rotated, whereby the suction nozzle 20 to be subjected to the next pick-up operation is revolved and moved to the part sucking and mounting position. Together with this operation, the parts mount mechanism 8 is moved relative to the tape feeder 5 which holds the electronic part to be picked-up next, and the aforesaid pick-up operation is repeatedly performed. When the nozzle change-over operation and the pick-up operation are repeatedly performed for a predetermined times, the suction nozzles 20 of the mounting heads 10A, 10B of the parts mount mechanism 8 hold predetermined electronic parts, respectively.

Thereafter, the process proceeds to a part mounting operation. That is, as shown in FIG. 5(a), the mounting heads 10A, 10B holding the electronic parts P at the suction nozzles 20 are moved on the board 3 positioned at the transfer paths 2 (a head moving process). Then, the electronic parts P held by the respective suction nozzles 20 are sequentially mounted on the mounting points of the board 3 (a parts mounting process).

In the parts mounting process, first, as shown in FIG. 5(b), in the mounting head 10A (one of the mounting heads), the suction nozzle 20 is lowered with respect to the board 3 to touch the electronic part P to the board 3. While the mounting head 10A performs this part mounting operation, as shown in FIG. 5(c), in the mounting head 10B (the other of the mounting heads), a nozzle change-over operation is performed in a manner that the suction nozzle 20 holding an electronic part to be mounted next is revolved around the rotation shaft 18a (see FIG. 2) by the rotor mechanism 18 and moved to the part sucking and mounting position.

The mounting head 10B thus completed the nozzle change-over operation mounts the electronic part P held by the suction nozzle 20 on the board 3, as shown in FIG. 5(d). While the mounting head 10B performs this part mounting operation, the mounting head 10A performs the nozzle change-over operation like the aforesaid manner thereby to move the suction-nozzle 20 holding an electronic part to be mounted next to the part sucking and mounting position. Hereinafter, the similar part mounting process is continued in a manner that while the electronic part P is mounted on the board 3 in one of the mounting heads, the other of the mounting heads performs the nozzle change-over operation that the suction nozzle holding an electronic part to be mounted next is moved to the part sucking and mounting position.

As explained above, in the electronic parts mounting apparatus according to the embodiment, a plurality of the rotary type multi-nozzle type mounting heads each provided with a plurality of the suction nozzles 20 are provided at the parts mount mechanism 8 which moves between the parts supply portion 4 and the board 3 positioned at the transfer paths 2.

Thus, without increasing the number of the suction nozzles equipped at the one mounting head or without increasing the rotation speed of the rotor mechanism 18 at the time of the nozzle change-over operation, the number of parts taken out can be increased during one mounting turn operation where the parts mount mechanism 8 makes a round trip between the parts supply portion 4 and the board 3. Therefore, it is not necessary to set the peripheral speed of the rotary mechanism at the time of changing over the nozzle to an excessively large value. As a result, the mounting operation can be realized stably with a high efficiency without causing such a problem that parts fall out or deviate due to the increase of the peripheral speed.

Further, at the time of disposing a plurality of the mounting heads so as to be movable integrally, since the rotation shaft 18a of the rotor mechanism 18 is set so as to be aligned with the arrangement direction of the tape feeders 5 of the parts supply portion 4, a plurality of the mounting heads can be disposed to be close from one another without causing positional interference between the rotor mechanisms.

Although, in the aforesaid embodiment, an example is shown in which the two mounting heads 10A, 10B are provided at the parts mount mechanism 8, a parts mount mechanism 8A provided with three mounting heads 10A, 10B, 10C may be used instead thereof as shown in FIG. 6. In this case, also a distance between the respective adjacent mounting heads is set in a manner that the shaft-to-shaft distance D1 between the adjacent suction nozzles 20 is plural times as large as the arrangement pitch of the tape feeders 5 of the parts supply portion 4.

Further, although in the aforesaid embodiment, an example is shown in which the suction nozzle 20 is moved up and down by the Z-axis motor 15 provided at each of the mounting heads, a nozzle elevation mechanism may be contained within the rotor mechanism 18 and the suction nozzle 20 at the parts suction position may be moved up and down with respect to the rotor mechanism 18.

According to the invention, in the parts mounting process for sequentially mounting electric parts held by the suction nozzles on the mounting points of the board by a plurality of the mounting heads, while one of the mounting heads operates in a manner that the suction nozzle is moved up and down with respect to the board thereby to mount an electronic part held by the suction nozzle on the board, the other of the mounting heads operates in a manner that the suction nozzle holding an electronic part to be mounted next is revolved around the rotation shaft thereby to complete the nozzle change-over operation for the next mounting operation. Thus, the electronic parts mounting apparatus provided with the rotary type multi-nozzle type mounting head can realize a mounting operation stably with a high efficiency.

What is claimed is:

1. An electronic parts mounting apparatus which takes out electronic parts from a parts supply portion, then transfers and mounts the parts on a board, the electronic parts mounting apparatus comprising:

a board positioning portion for positioning the board transferred in a first direction;

parts feeders arranged with a predetermined pitch along the first direction at the parts supply portion;

a plurality of mounting heads secured together in parallel in each of which a plurality of suction nozzles, each revolving around a horizontal rotation shaft set so as to be aligned with the first direction and being capable of sucking and holding the electronic part, are disposed in a radial manner around the rotation shaft; and a single head moving means for integrally moving a plurality of the mounting heads between the parts supply portion and the board positioning portion, wherein the single head moving means is configured to operatively connect the mounting heads such that the mounting heads cannot move independently with respect to each other.

2. The electronic parts mounting apparatus according to claim 1, wherein a plurality of the mounting heads are disposed in parallel from one another along the first direction.

3. The electronic parts mounting apparatus according to claim 2, wherein a distance between the adjacent mounting heads is set in a manner that a shaft-to-shaft distance between the suction nozzles provided at the respective mounting heads is plural times as large as an arrangement pitch of the parts feeders of the parts supply portion.

4. The electronic parts mounting apparatus according to claim 2, wherein each of a plurality of the mounting heads is provided with a parts recognition camera for recognizing the electronic parts.

5. An electronic parts mounting method for transferring and mounting electronic parts on a board by using an electronic part mounting apparatus which comprising: a board positioning portion for positioning the board transferred in a first direction; parts feeders arranged with a predetermined pitch along the first direction at the parts supply portion; a plurality of mounting heads secured together in parallel in each of which a plurality of suction nozzles, each revolving around a horizontal rotation shaft set so as to be aligned with the first direction and being capable of sucking and holding the electronic part, are disposed in a radial manner around the rotation shaft; and head moving means for integrally moving a plurality of the mounting heads between the parts supply portion and the board positioning portion, the electronic parts mounting method comprising:

a pick-up step for moving a plurality of the mounting heads to the parts supply portion and taking out electronic parts from the parts feeders by using the suction nozzles of the mounting heads;

a head moving step in which a single head moving means moves a plurality of the mounting heads holding the electronic parts to the board positioning portion such that the mounting heads cannot move independently with respect to each other; and a parts mounting step for sequentially mounting the electronic parts held by the respective suction nozzles on mounting points of the board by a plurality of the mounting heads, respectively, wherein in the parts mounting step, while the suction nozzle in one of the mounting heads is moved up and down with respect to the board to mount an electronic part held by the suction nozzle on the board, the suction nozzle holding an electronic part to be mounted next in another of the mounting heads is revolved around the rotation shaft.

6. The electronic parts mounting method according to claim 5, wherein in the pick-up step, electronic parts are simultaneously picked up by a plurality of the mounting heads from a plurality of the parts feeders.

7. The electronic parts mounting method according to claim 5, wherein the electronic parts held by a plurality of the mounting heads are recognized by parts recognition cameras respectively provided at a plurality of the mounting heads.

* * * * *